(12) United States Patent  (10) Patent No.: US 7,015,522 B2
Miyagawa et al.  (45) Date of Patent: Mar. 21, 2006

(54) SOLID-STATE IMAGE SENSOR

(75) Inventors: Ryohei Miyagawa, Mukou (JP); Shoji Tanaka, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/099,629

(22) Filed: Apr. 6, 2005

(65) Prior Publication Data

US 2005/0230720 A1    Oct. 20, 2005

(30) Foreign Application Priority Data

Apr. 16, 2004  (JP)  .............................. 2004-121849

(51) Int. Cl.
 *H01L 31/062* (2006.01)
 *H01L 31/113* (2006.01)
(52) U.S. Cl. ...................................... 257/292; 257/462
(58) Field of Classification Search ................ 257/258, 257/291, 292, 293, 294, 461, 462, 463, 464
 See application file for complete search history.

(56) References Cited

U.S. PATENT DOCUMENTS 5,977,576 A * 11/1999 Hamasaki .................... 257/292

FOREIGN PATENT DOCUMENTS

| JP | 03-201478 | 9/1991 |
| JP | 2000-286405 | 10/2000 |
| JP | 2003-188367 A | 7/2003 |

* cited by examiner

*Primary Examiner*—Hoai Pham
(74) *Attorney, Agent, or Firm*—McDermott Will & Emery LLP

(57) ABSTRACT

A solid-state image sensor of the present invention includes a semiconductor substrate 1 having a plurality of pixels, and each of the pixels comprises an impurity layer a photoelectric converting layer, a read out region, and a gate electrode. The impurity layer includes an adjoining portion adjacent to a portion of the substrate directly beneath the gate electrode The adjoining portion includes sub-portions aligned along a width direction of a gate that is orthogonal to a transfer direction of a signal charge and a thickness direction of the substrate. An impurity density in the sub-portion 2a including a center of the adjoining portion is lower than that in the sub-portions.

4 Claims, 5 Drawing Sheets

INITIAL STATUS

SOLID-STATE IMAGE SENSOR

BACKGROUND OF THE INVENTION (1) Field of the Invention

The present invention relates to a solid-state image sensor, and more specifically to a structure of a pixel.

(2) Description of the Related Art

In recent years, MOS image sensors have been gaining more attention in the field of solid-state image sensors, because the MOS image sensors are more advantageous in downsizing and reducing power consumption than charge-coupled device (CCD) image sensors.

The MOS image sensors have a structure in which a plurality of pixels are arranged in matrix on a p-type semiconductor substrate (or a p-type well). Signal charges in the pixels, each generated according to an amount of light received in each pixel, are scanned by low and column and read out sequentially, and then image data for one frame is outputted. Each pixel includes a photoelectric converting layer, a gate electrode, and a read out region.

The photoelectric converting layer is an n-type region formed in the p-type semiconductor substrate. A depletion region, where carriers of the both regions disappear after getting combined to each other, is formed in vicinity of a border between the p-type region and the n-type region. In other words, in the depletion region, there is no electron in the n-type region and no hole in the p-type region. Thus, a potential at the n-type region is relatively higher than that at the p-type region in the depletion region, which indicates that an internal electric field is generated in the depletion region.

With a sufficient amount of incident light, electron-hole pairs are created in the semiconductor substrate. When the electron-hole pairs are created in the depletion region, electrons and holes are drifted in opposite directions due to the internal electric field. The electrons are collected in the n-type region, and then become a signal charge.

The gate electrode controls transferring the signal charge from the photoelectric converting layer to the read out region. When a positive gate voltage is applied to the gate electrode, a channel is formed at a region of the substrate directly below the gate electrode. The signal charge is transferred through this channel from the photoelectric converting layer to the read out region.

In general, many crystal defects can be observed in vicinity of a surface of the substrate due to an impurity implantation. In such a part in the substrate, the electron-hole pairs are created by thermal excitation. Because the excitation of these electrons is not based on the amount of received light, these electrons become a noise component when collected to form the signal charge, and result in defects known as white spot defects.

As one solution to eliminate such white spot defects, Japanese Laid-Open Patent Application No. 2001-345437 discloses a solid-state image sensor having an impurity layer positioned at a surface of a substrate and a photoelectric converting layer positioned directly beneath the impurity layer. The impurity layer is formed by implanting a p-type impurity at a high density. Increasing the impurity density in the impurity layer keeps the depletion region in the photoelectric converting layer from spreading to the surface of the substrate. Therefore, even if the electrons are thermally excited in vicinity of the surface of the substrate, the electrons are not collected to the depletion region. As a result, it is possible to eliminate the white spot defects.

The above conventional technique, however, also presents a new problem as described below, even though the problem caused by the white spot defects can be solved by the conventional technique.

When the density of the p-type impurity is high, it becomes hard to form the channel sufficiently at the region of the substrate directly below the gate electrode, and not all of the signal charge can be transferred. As a result, an amount of the transferred signal charge decreases, and a signal-noise ratio deteriorates. This hinders production of the image sensors with high-sensitivity.

Increasing the gate voltage makes it possible to form the channel sufficient to transfer all of the signal charge. However, this increases an amount of power consumption as well, which hinders production of the low-power image sensors.

SUMMARY OF THE INVENTION

In view of the above problem, an object of the present invention is to provide a high-sensitive and low-power solid-state image sensor without having white spot defects.

The solid-state image sensor according to the present invention has a plurality of pixels, and each pixel comprises an impurity layer positioned substantially at a surface of a semiconductor substrate, and formed by doping the substrate with an impurity, a photoelectric converting layer positioned directly beneath the impurity layer within the substrate, and generating a signal charge according to an amount of light received, a read out region that is positioned within the substrate so as to be apart from the impurity layer and photoelectric converting layer, and to which the generated signal charge is transferred, and a gate electrode disposed on the substrate so as to cover at least part of the substrate between the impurity layer and read out region, and controlling the transfer of the signal charge from the photoelectric converting layer to the readout region, wherein the impurity layer includes a portion adjoining a portion of the substrate directly beneath the gate electrode, the adjoining portion includes a plurality of sub-portions aligned along a width direction of a gate that is orthogonal to a transfer direction of the signal charge and a thickness direction of the substrate, and an impurity density is lower in a sub-portion including a center of the adjoining portion than in the other sub-portions.

The above solid-state image sensor includes the impurity layer, and the white spot defects can be eliminated by such a structure. Further, the signal charge tends to be accumulated around a central part of the photoelectric converting layer. Therefore, the impurity density in the central sub-portion including the center is set to be lower than that in a rest of the impurity layer. By this, a channel can be easily formed at the central sub-portion when a predetermined gate voltage is applied to the gate electrode. Thus, it is possible to transfer all of the signal charge accumulated in the photoelectric converting layer to the read out region without raising the gate voltage.

The solid-state image sensor may also be such that the impurity density in one of the sub-portions is lower than the impurity density in another sub-portion adjacent thereto and farther from the central sub-portion.

The signal charge in the photoelectric converting layer is more densely accumulated in vicinity of the central part than in a peripheral part. By the above structure, the channel can be easily formed in vicinity of the central part than in a peripheral part. Thus, it is possible to transfer the signal charge efficiently.

The solid-state image sensor may also be such that the adjoining portion consists of three sub-portions including the central sub-portion and two sub-portions each at an end of the adjoining portion, and the impurity density in the end sub-portions is equal to the impurity density in a rest of the impurity layer excluding the central sub-portion.

According to the above structure, the impurity density desired for the impurity layer is two-tiered. Thus, it is possible to simplify manufacturing process.

The solid-state image sensor may also be such that the impurity density in the central sub-portion is in a range of $1\times10^{16}$ atoms/cm$^3$ inclusive to $1\times10^{18}$ atoms/cm$^3$ exclusive, to a depth of at least 100 nm from the surface of the substrate, and the impurity density in the end sub-portions is in a range of $1\times10^{18}$ atoms/cm$^3$ inclusive to $5\times10^{19}$ atoms/cm$^3$ exclusive, to a depth of at least 50 nm from the surface of the substrate.

From the result of the simulation that was performed by the inventors using the impurity density as a parameter, it has been revealed that the above figures are most preferable ranges for the respective sub-portions in the impurity layer.

BRIEF DESCRIPTION OF THE DRAWINGS

These and the other objects, advantages and features of the invention will be come apparent from the following description thereof taken in conjunction with the accompanying drawings which illustrate a specific embodiment of the invention.

In the drawings.

DESCRIPTION OF THE PREFERRED EMBODIMENT

The following describes a preferred embodiment of the present invention with reference to the drawings.

[Outline]

In an MOS image sensor according to the present invention, an impurity density in a sub-portion positioned at a center of a portion in an impurity layer is set to be lower than in a rest of the impurity layer. Such an improvement is made as a result of finding out a tendency that the accumulated signal charge becomes greater at the center than a peripheral part of a photoelectric converting layer. By the above structure, it is possible to produce high-sensitive and low-power MOS image sensors without having white spot defects.

[Structure]

FIG. 1 illustrates a structure of a pixel in the MOS image sensor according to the present invention.

Figure 1A:
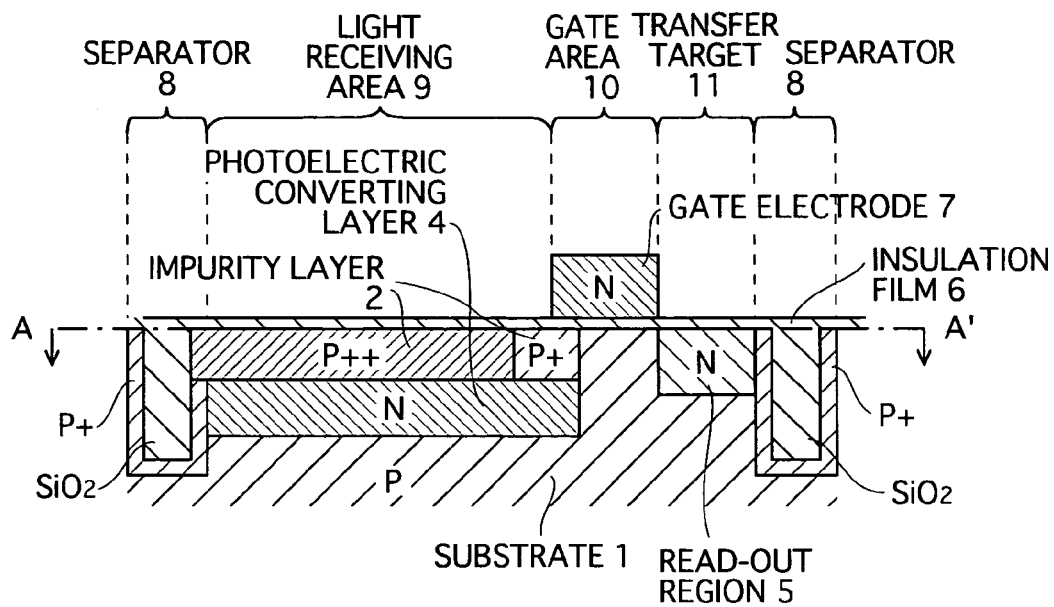
FIG. 1 illustrates a structure of a pixel in an MOS image sensor according to the present invention.
Figure 1B:
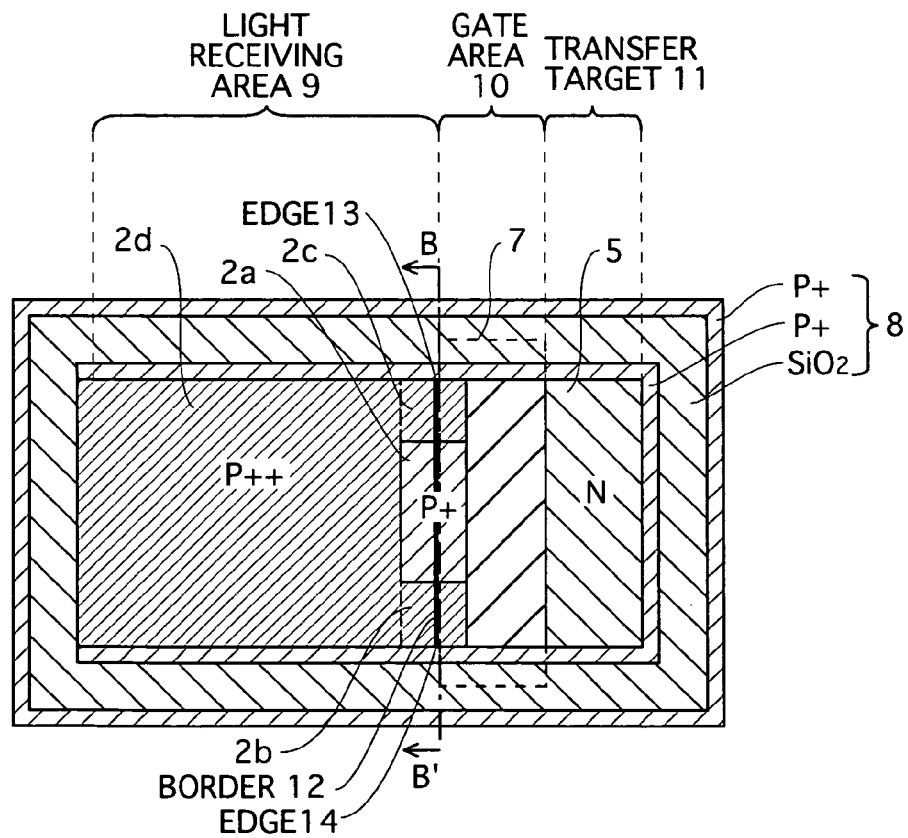

FIG. 1A shows a sectional view of the pixel provided to a substrate. FIG. 1B shows a plain view of the pixel taken at line A–A' of FIG. 1A, viewed from a direction perpendicular to a surface of the substrate.

The MOS image sensor has a structure such that a plurality of pixels are arranged in matrix on a substrate 1 of a p-type semiconductor. A signal charge generated in each pixel according to an amount of light received is scanned and read out by low and column, and then image data for one frame is generated.

First, the structure of the pixel is explained in reference to FIG. 1A.

The pixel includes an impurity layer 2, a photoelectric converting layer 4, a read out region 5, and a gate electrode 7.

The impurity layer 2 is positioned substantially at a surface of the substrate 1, by adding a p-type impurity such as boron so that an impurity density in the impurity layer 2 becomes higher than that in the substrate 1.

The photoelectric converting layer 4 is positioned directly beneath the impurity layer 2 within the substrate 1. An n-type impurity such as phosphorus and arsenic is added to the substrate 1 to form the photoelectric converting layer 4. Because the photoelectric converting layer 4 is surrounded by the p-type semiconductors (the impurity layer 2 and substrate 1), the photoelectric converting layer 4 has a depletion region where carriers in the impurity layer 2 and substrate 1 are combined and disappear.

Incident light to a light receiving area 9 is converged by a micro lens (not depicted in the drawings) positioned above the substrate 1, and reaches the light receiving area 9 through an opening of a shield (not depicted in the drawings) by passing through a color filter (not depicted in the drawings) that selects a wavelength in the incident light. The light to areas other than the light receiving area 9 is shielded by the shield.

An electron-hole pair is created when the photoelectric converting layer 4 receives the light, and an electron in the pair is collected to the photoelectric converting layer 4 by an effect of an internal electric field. As described above, the photoelectric converting layer 4 generates the signal charge according to the amount of light received.

In order to have the photoelectric converting layer 4 fully depleted at an initial state so that all of the carrier electrons therein disappear, the density of the n-type impurity of the photoelectric converting layer 4 is set to be sufficiently lower than the density of the p-type impurity of the p-type semiconductor that surrounds the photoelectric converting layer 4.

In general, the depletion region spreads towards a direction in which the impurity density becomes lower. In a case of the present embodiment, the depletion region spreads toward the substrate 1, and not to the impurity layer 2. Accordingly, the impurity layer 2 is not depleted, and even when the electrons are thermally excited in the impurity layer, these electrons are not collected in the photoelectric converting layer 4. Thus, the white spot defects can be eliminated by positioning the impurity layer 2 and photoelectric converting layer 4 in the above manner.

The read out region 5 is a target to which the signal charge generated in the photoelectric converting layer 4 is transferred. The MOS image sensor outputs a voltage signal according to the signal charge transferred to the read out region 5.

The gate electrode 7 is disposed on the substrate 1 so as to cover at least part of the substrate between the impurity layer 2 and read out region 5. When a positive gate voltage is applied to the gate electrode 7, a channel is created at a region of the substrate 1 directly below the gate electrode 7.

Through this channel, the signal charge can be transferred from the photoelectric converting layer 4 to the read out region 5.

The gate voltage is applied by a row scanning circuit (not depicted in the drawings) of the MOS image sensor. For example, the gate voltage is 3 v when the signal charge is transferred, and 0 v otherwise. By this, the channel is created at the region of the substrate 1 directly below the gate electrode 7 when transferring, and disappears when not transferring.

Note that one pixel is typically divided into the light receiving area 9, a gate area 10, and a transfer target 11, and electrically insulated by a separator 8 from an adjacent pixel. The separator 8 has a shallow trench isolation (STI) structure.

FIG. 1B shows the above pixel viewed from a direction perpendicular to the surface of the substrate 1.

As shown in FIG. 1B, a shape of a part (border 12) of the light receiving area 9 depends on a shape of the gate electrode 7.

A major characteristic of the present embodiment lies in that the impurity layer includes a portion adjoining the region of the substrate 1 directly below the gate electrode 7, and the adjoining portion includes sub-portions 2a, 2b, and 2c, and an impurity density in the sub-portion 2a including a center of the adjoining portion is lower than that in the sub-portions 2b and 2c.

The channel is more easily created, as the density of the p-type impurity at the region of the substrate 1 directly below the gate electrode 7 becomes lower. Therefore, in the MOS image sensor, the channel is more easily created in vicinity of the sub-portion 2a than in vicinity of the sub-portions 2b and 2c. The following describes reasons why the above structure is desirable to realize the high-sensitive and low-power MOS image sensor.

Figure 2:
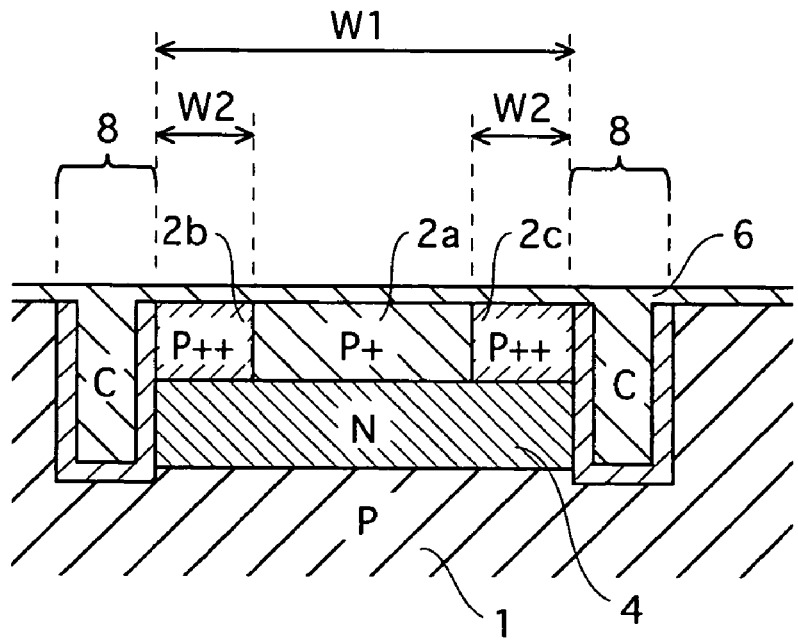
FIG. 2 is a diagram showing a potential curve in the light receiving area.
Figure 2:
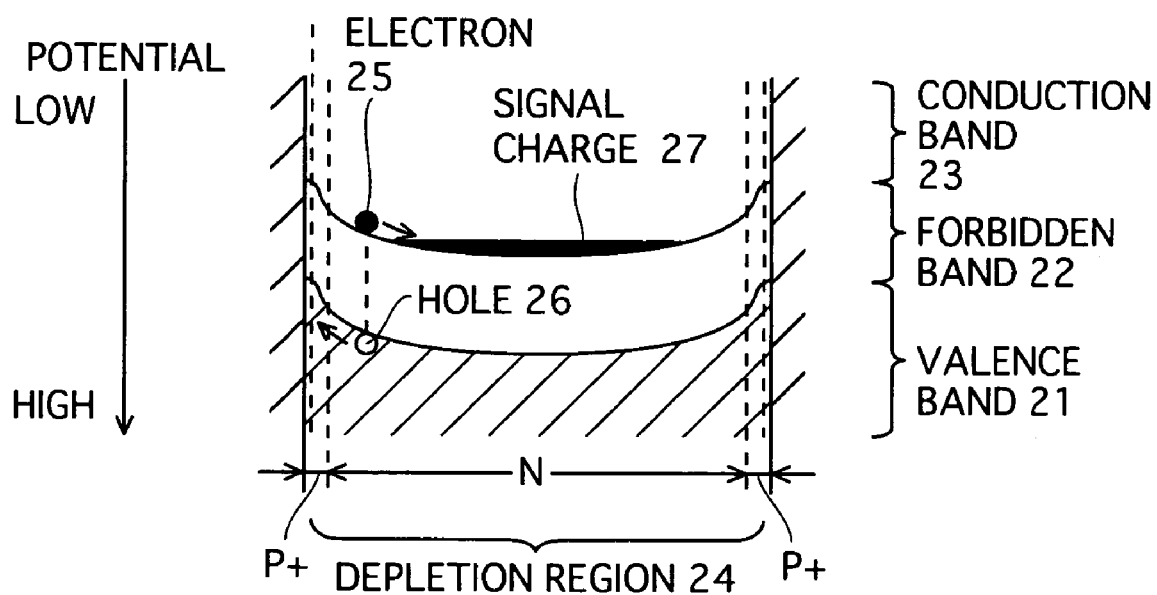

FIG. 2 is a diagram showing a potential curve in the light receiving area.

A sectional view in FIG. 2 is taken at line B–B' in FIG. 1B. The potential curve indicates potentials at a line C–C' in the sectional view of FIG. 2.

The line C–C' is the line that passes through the photoelectric converting layer 4.

In general, carriers in a p-type region are combined to carriers in an n-type region and disappear in vicinity of a border between the two regions. Therefore, a potential at the photoelectric converting layer 4, which is the n-type region, is relatively high, and a potential at the separator 8, which is the p-type region, is relatively low. As shown in FIG. 2, the potential at the photoelectric converting layer 4 becomes higher at the center than around the border. In the pixel, the density of the n-type impurity of the photoelectric converting layer 4 is set to be sufficiently lower than the density of the p-type impurity of the separator 8. Thus, all of the electrons in the photoelectric converting layer 4 that are the carriers disappear (the depletion region 24).

When the photoelectric converting layer 4 receives the incident light, electrons in a valence band 21 are excited to a conduction band 23 and holes are created in the valence band 21. When such electron-hole pairs are created in the depletion region 24, an electron 25 drifts toward the center of the photoelectric converting layer 4 where the potential is higher, and a hole 26 drifts toward the p-type region where the potential is lower, by the effect of the internal electric field. The electron 25 is collected in the photoelectric converting layer 4 to become a signal charge 27.

Because the potential gradually increases from an edge to the center of the photoelectric converting layer 4, the signal charge 27 is mainly accumulated in vicinity of the center of the photoelectric converting layer 4. In order to transfer all of the signal charge 27 without left out, it is desirable to have such a structure that the channel can be easily created around the sub-portion 2a. Accordingly, in the present embodiment, the impurity density of the sub-portion 2a is set to be lower than that of the sub-portions 2b and 2c.

Next, the following explains the impurity density and depth of the impurity layer 2 according to the present invention.

(1) Sub-portions 2b and 2c, and portion 2d in the impurity layer 2

Many crystal defects can be found on the surface of the substrate 1 caused by damages during wafer fabrication such as gate formation. These crystal defects forms a defect level in a band gap (forbidden band 22) between the conduction band 23 and valence band 21. The electrons are thermally excited from the valence band 21 to the conduction band 23 via the defect level. The white spot defects are caused when the electrons thermally excited are collected in the photoelectric converting layer 4.

The present invention provides the impurity layer 2 having a high density of the p-type impurity that is positioned substantially at a surface of the substrate 1, in order to deactivate the defect level. When the density of the p-type impurity is high, there will be little thermal excitation of the electrons because the defect level is occupied by the holes. This effect becomes more notable as the density of the p-type impurity becomes higher.

In order to sufficiently suppress the occurrence of the white spot defects, the impurity density in the sub-portions $2b$, $2c$, and $2d$ is required to be $1 \times 10^{18}$ atoms/cm$^3$ or above, to a depth of at least 50 nm from the surface.

On the other hand, the white spot defects are also caused when the impurity density is too high. This is because an amount of the crystal defects due to the impurity increases and dislocation defects grow into the photoelectric converting layer 4 over the impurity layer 2. The white spot defects are caused if the photoelectric converting layer 4 has the dislocation defects. Therefore, it is desirable that the impurity density in the p-type impurity layer 2 is less than $5 \times 10^{19}$ atoms/cm$^3$.

As described above, it is sufficient when the impurity density in the sub-portions $2b$ and $2c$ and the portion $2d$ is in a range of $1 \times 10^{18}$ atoms/cm$^3$ inclusive to $5 \times 10^{19}$ atoms/cm$^3$ exclusive, to the depth of at least 50 nm from the surface.

(2) Sub-portion 2a in the impurity layer 2

The high impurity density in the sub-portion 2a in the impurity layer 2 makes it difficult to transfer the signal charge accumulated in the photoelectric converting layer 4, and unread charges can be left in the photoelectric converting layer 4 without transferred. Therefore, in the present embodiment, the impurity layer 2 is provided with the sub-portion 2a whose impurity density is lower than that in the sub-portions 2b and 2c and the portion 2d. To this effect, it is desirable that the impurity density in the sub-portion 2a is lower than $1 \times 10^{18}$ atoms/cm$^3$. Although the impurity density in the sub-portion 2a is not very high, it is possible to substantially eliminate the white spot defects by making an area of the sub-portion 2a sufficiently small, in addition to setting the impurity density appropriately.

On the other hand, at least a part of the gate electrode 7 in vicinity of a surface facing to the substrate 1 is made of an n-type polysilicon. Accordingly, a part close to the gate electrode 7 and in the region of the substrate 1 directly below the gate electrode 7 can be depleted due to a built-in voltage. In the part in the region of the substrate 1 directly below the gate electrode 7, the electrons are thermally excited via the defect level, and the white spot defects can be caused if these electrons are collected in the photoelectric converting layer 4. However, it is possible to create an impurity barrier between the photoelectric converting layer 4 and the depletion regions in the part in the region of the substrate 1 directly below the gate electrode 7, by setting the impurity density in the impurity layer 2 sufficiently high. By this, it is possible to prevent the electrons thermally excited in the gate from being collected in the photoelectric converting layer 4. In order to realize this, the impurity density in the impurity layer 2 needs to be more than $1\times10^{16}$ atoms/cm$^3$ inclusive to a depth of at least 100 nm from the surface of the substrate.

When the barrier is created, the electrons excited in the depletion region in the region of the substrate 1 directly below the gate electrode 7 are discharged to the read out region 5 which is kept at a high potential.

As described above, it is desirable that the impurity density in the sub-portion 2a of the impurity layer 2 is in a range of $1\times10^{16}$ atoms/cm$^3$ inclusive to $1\times10^{18}$ atoms/cm$^3$ exclusive, to the depth of at least 100 nm from the surface.

Next, the following describes a shape of each portion in the impurity layer 2. When a distance between the sub-portion 2d and the gate area 10 is short, it is not possible to transfer all of the signal charge accumulated in the photoelectric converting layer 4. Therefore, the distance between the sub-portion 2d and the gate area 10 is required to be 0.1 μm or greater in a transfer direction of the signal charge.

Further, defects can easily occur at edges 13 and 14 because a stress concentrates at a border between the gate electrode 7 and separator. Therefore, it is desirable to set a width of the sub-portion 2b and 2c of the impurity layer 2 in a width direction of the gate to be sufficiently wide, i.e. it is desirable that the width of the sub-portion 2b and 2c is 0.1 μm or greater.

[Operation]

The following describes operation of the MOS image sensor according to the present invention.

FIG. 3 illustrates operational states of the pixel in the sectional view shown in FIG. 1A.

The state of the pixel transits from A. Initial State, B. Exposure, C. Transfer, to D. Transfer Completed, in an order.

Figure 3A:
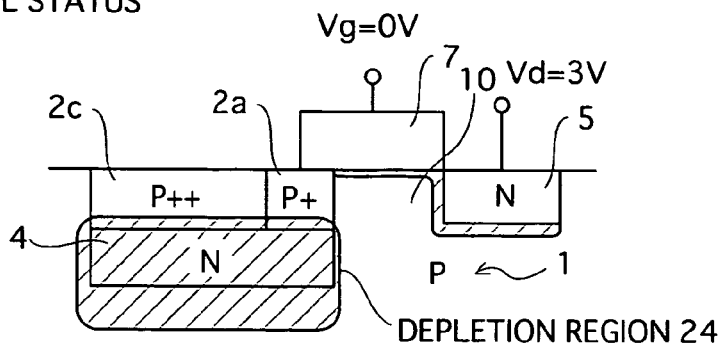
FIG. 3 illustrates operational states of the pixel in the sectional view shown in FIG. 1A.

FIG. 3A illustrates the initial state of the pixel.

In the initial state, a gate voltage Vg is 0 v, and a drain voltage Vd is 3 v.

The depletion region 24 is created by the electrons and holes combining and disappearing in the photoelectric converting layer 4. The photoelectric converting layer 4 is fully depleted.

Figure 3B:
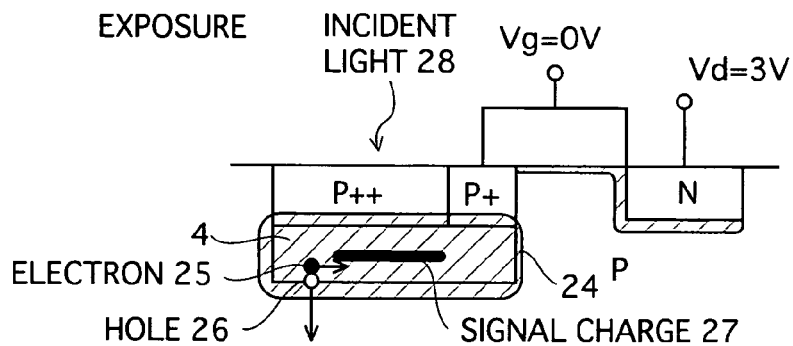

FIG. 3B illustrates the pixel at exposure.

When being exposed, an electron-hole pair of the electron 25 and hole 26 is created by an incident light 23. The electron 25 drifts toward in vicinity of the center of the photoelectric converting layer 4 due to the internal electric field in the depletion region 24, and collected as the signal charge 27. The hole 26 drifts toward the substrate 1 also due to the internal electric field, and then discharged outside the substrate 1.

When the amount of light received in the photoelectric converting layer 4 is large, electron-hole pairs are created one after another, and a total quantity of the signal charge 27 becomes large. On the other hand, when the amount of light received in the photoelectric converting layer 4 is small, the total quantity of the signal charge 27 also becomes small.

Figure 3C:
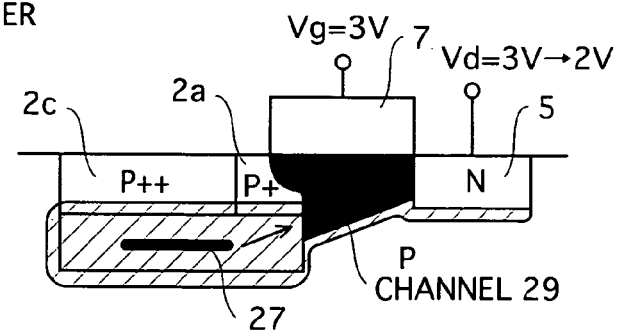

FIG. 3C illustrates the pixel at the transfer state.

During the transfer, the gate voltage Vg is 3 v. This raises the potential at the region of the substrate 1 directly below the gate electrode 7, and a repulsive force drives the hole deep into the substrate 1. At the same time, an attractive force pulls the electron toward the gate directly below the gate electrode 7 so as to create a channel 29. When sufficiently developed, the channel 29 conducts between the photoelectric converting layer 4 and read out region 5, and the signal charge 27 is transferred from the photoelectric converting layer 4 to read out region 5. This lowers the drain voltage Vd.

Figure 3D:
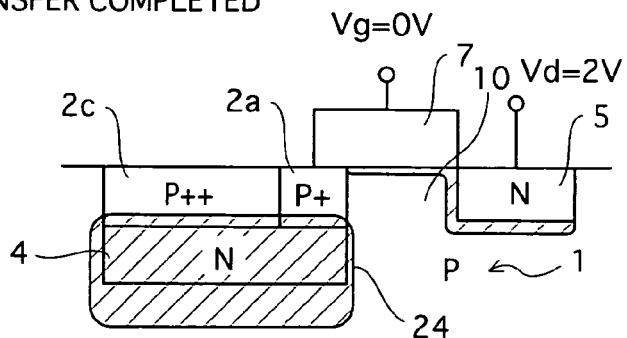

FIG. 3D illustrates the pixel when the transfer has been completed.

In the state in which the transfer has been completed, the gate voltage is 0 v again. The signal charge 27 has been completely read out, and the drain voltage Vd at the read out region 5 has dropped to 2 v at the time of completion. The difference 1 v of the drain voltage is a signal voltage for the pixel. Once the signal voltage is read out by a circuit behind the pixel, the pixel is reset to the initial state for the next cycle.

As described above, the major characteristic of the present embodiment lies in that the impurity layer 2 includes the adjoining portion including the sub-portions 2a, 2b, and 2c and adjacent to the region of the substrate 1 directly below the gate electrode 7, and the impurity density in the sub-portion 2a including a center of the adjoining portion is lower than that in the sub-portions 2b and 2c.

By this, it is possible to eliminate the white spot defects in the MOS image sensor, and realize the MOS image sensor with high sensitivity and low power consumption.

The above object of the present invention can be achieved by many other variations of the present embodiment. The following describes four examples of such variations.

Figure 4:
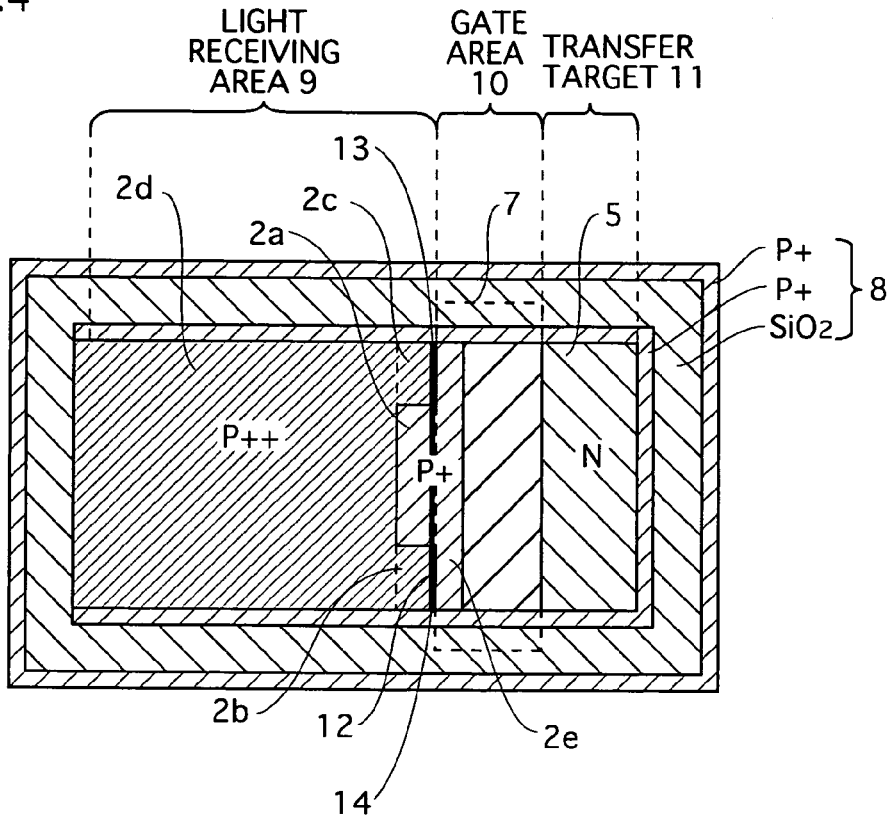
FIG. 4 is a plain view of a pixel according to a modified example 1.

FIG. 4 is a plain view of a pixel according to a modified example 1.

In the modified example 1, the impurity density in the sub-portion 2a of the adjoining portion and a portion 2e of the impurity layer 2 is equal. The portion 2e overlaps with a part of a portion of the substrate 1 that is directly below the gate electrode. An advantage of this modified example is that it is possible to simplify manufacturing process because the sub-portions 2b and 2c, and the portion 2d can be formed self-aligningly after the gate electrodes 7 is disposed.

Figure 5:
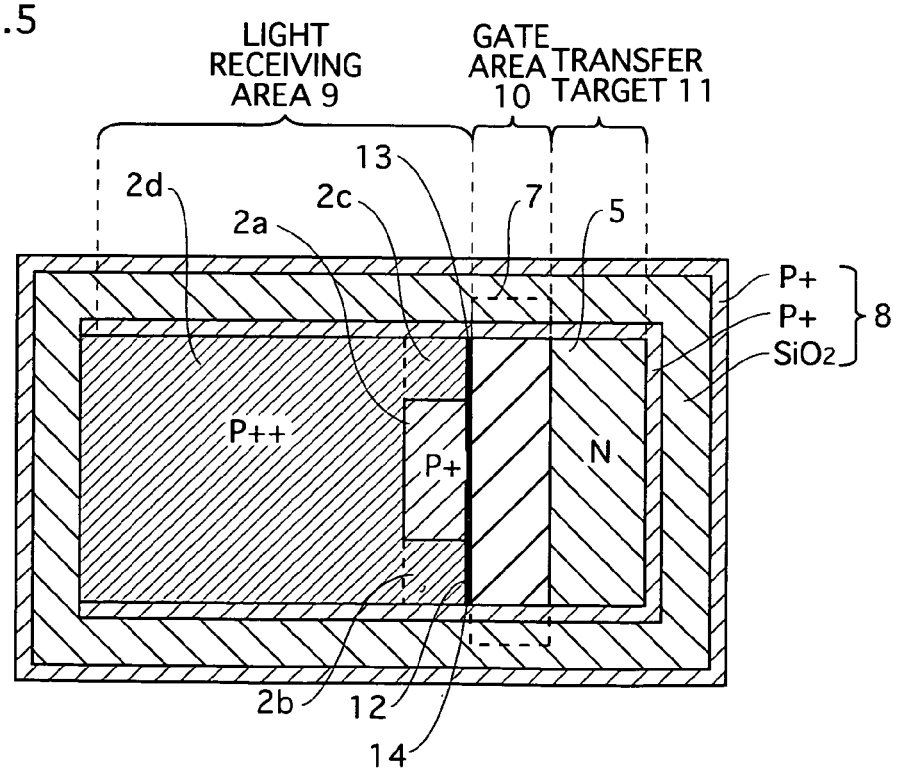
FIG. 5 is a plain view of a pixel according to a modified example 2.

FIG. 5 is a plain view of a pixel according to a modified example 2.

In the modified example 2, the impurity layer 2 does not overlap with the region of the substrate 1 directly below the gate electrode 7. An advantage of this modified example is that it is possible to simplify the manufacturing process because the photoelectric converting layer 4 and impurity layer 2 can be formed self-aligningly after the gate electrodes 7 is disposed.

Figure 6:
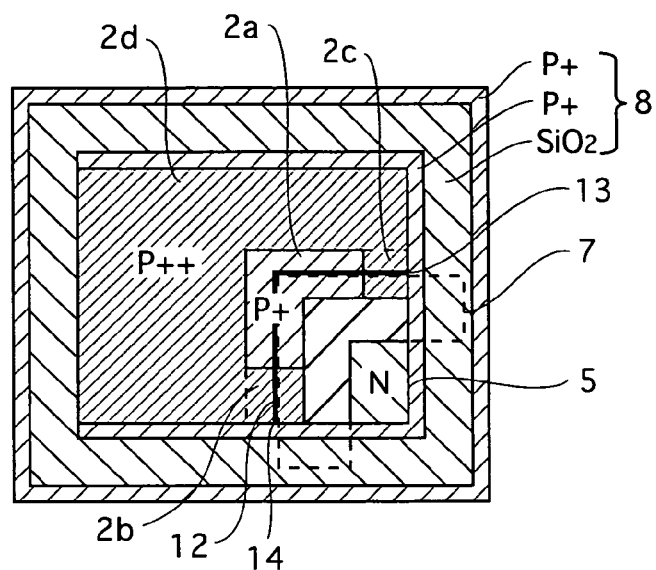
FIG. 6 is a plain view of a pixel according to a modified example 3.

FIG. 6 is a plain view of a pixel according to a modified example 3.

In the modified example 3, the gate electrode 7 has a bend.

Even when the gate electrode 7 has the bend as shown in the drawing, it is possible to make the impurity density lower in the sub-portion 2a than in the sub-portions 2b and 2c.

Figure 7:
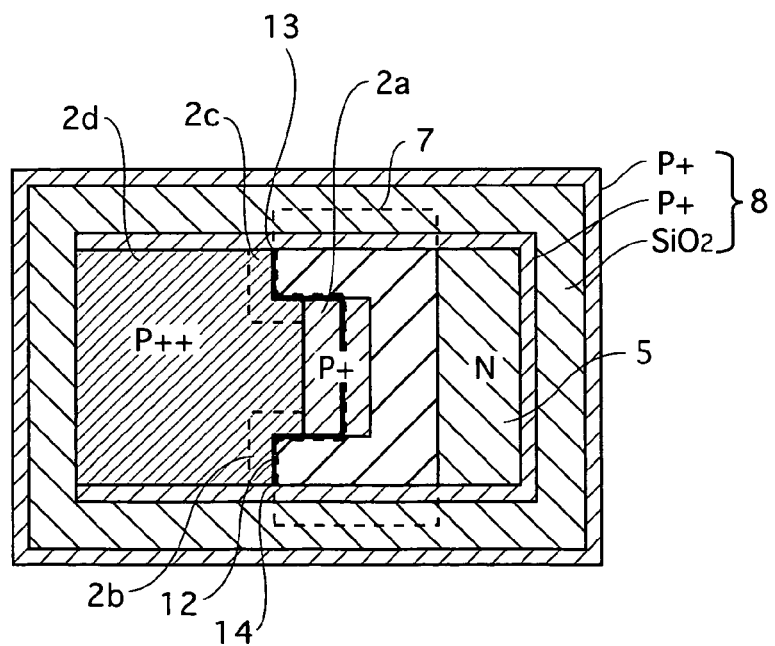
FIG. 7 is a plain view of a pixel according to a modified example 4.

FIG. 7 is a plain view of a pixel according to a modified example 4.

The gate electrode 7 has more than one bend in the modified example 4.

In the modified example 4, as in the modified embodiment 3, it is also possible to make the impurity density lower in the sub-portion 2a than in the sub-portions 2b and 2c.

The present embodiment describes a case in which the impurity density in the sub-portion 2a is lower than a rest of the impurity layer 2 (the sub-portions 2b and c and the portion 2d), i.e. the case in which the impurity density is two-tiered. However, the tier of the impurity density is not restricted to two, and can be more than that.

Further, the present embodiment describes a case in which the adjoining portion includes the three sub-portions 2a, 2b, and 2c. However, the adjoining portion may include more than four sub-portions. When the sub-portions are more than four, it is desirable that the impurity density in any of the sub-portions is lower than that in another sub-portion adjacent thereto and farther from the central sub-portion.

Moreover, although the adjoining portion includes the three sub-portions in the present embodiment, it is also possible to realize the effect of the present invention in a case in which the adjoining portion includes only two sub-portions.

In addition, the present embodiment describes a case in which the plurality of pixels are provided to the p-type semiconductor substrate. However, it is also possible that he plurality of pixels are provided to a p-type well.

Furthermore, the present embodiment describes a case in which the electrons become the signal charge. However, the present invention is not restricted to this case, and the holes may be the signal charge. This modification can be realized by switching the p-type and n-type for each element in the pixel as explained in the embodiments.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A solid-state image sensor having a plurality of pixels, each pixel comprising:
    an impurity layer positioned substantially at a surface of a semiconductor substrate, and formed by doping the substrate with an impurity;
    a photoelectric converting layer positioned directly beneath the impurity layer within the substrate, and generating a signal charge according to an amount of light received;
    a read out region that is positioned within the substrate so as to be apart from the impurity layer and photoelectric converting layer, and to which the generated signal charge is transferred; and
    a gate electrode disposed on the substrate so as to cover at least part of the substrate between the impurity layer and read out region, and controlling the transfer of the signal charge from the photoelectric converting layer to the read out region, wherein
    the impurity layer includes a portion adjoining a portion of the substrate directly beneath the gate electrode, the adjoining portion includes a plurality of sub-portions aligned along a width direction of a gate that is orthogonal to a transfer direction of the signal charge and a thickness direction of the substrate, and an impurity density is lower in a sub-portion including a center of the adjoining portion than in the other sub-portions.

2. A solid-state image sensor according to claim 1, wherein
    the impurity density in one of the sub-portions is lower than the impurity density in another sub-portion adjacent thereto and farther from the central sub-portion.

3. A solid-state image sensor according to claim 2, wherein
    the adjoining portion consists of three sub-portions including the central sub-portion and two sub-portions each at an end of the adjoining portion, and
    the impurity density in the end sub-portions is equal to the impurity density in a rest of the impurity layer excluding the central sub-portion.

4. A solid-state image sensor according to claim 3, wherein
    the impurity density in the central sub-portion is in a range of $1 \times 10^{16}$ atoms/cm$^3$ inclusive to $1 \times 10^{18}$ atoms/cm$^3$ exclusive, to a depth of at least 100 nm from the surface of the substrate, and
    the impurity density in the end sub-portions is in a range of $1 \times 10^{18}$ atoms/cm$^3$ inclusive to $5 \times 10^{19}$ atoms/cm$^3$ exclusive, to a depth of at least 50 nm from the surface of the substrate.

* * * * *